(12) United States Patent
Subramaniam et al.

(10) Patent No.: US 7,494,829 B2
(45) Date of Patent: Feb. 24, 2009

(54) IDENTIFICATION OF OUTLIER SEMICONDUCTOR DEVICES USING DATA-DRIVEN STATISTICAL CHARACTERIZATION

(75) Inventors: Suresh Subramaniam, Richardson, TX (US); Amit Vijay Nahar, Dallas, TX (US); Thomas John Anderson, Dallas, TX (US); Kenneth Michael Butler, Richardson, TX (US); John Michael Carulli, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 11/864,283

(22) Filed: Sep. 28, 2007

(65) Prior Publication Data

US 2008/0262793 A1  Oct. 23, 2008

Related U.S. Application Data

(60) Provisional application No. 60/912,612, filed on Apr. 18, 2007.

(51) Int. Cl.
*G01R 31/26* (2006.01)
*G06F 17/18* (2006.01)

(52) U.S. Cl. ............... 438/14; 438/17; 702/179; 324/765

(58) Field of Classification Search ........... 257/E21.507
See application file for complete search history.

(56) References Cited

U.S. PATENT DOCUMENTS 7,129,735 B2 * 10/2006 Subramaniam et al. ..... 324/765
2006/0028229 A1 * 2/2006 Subramaniam et al. ..... 324/765

* cited by examiner

*Primary Examiner*—Walter L Lindsay, Jr.
*Assistant Examiner*—Mohsen Ahmadi
(74) *Attorney, Agent, or Firm*—Alan K. Stewart; W. James Brady; Frederick J. Telecky, Jr.

(57) ABSTRACT

Systems and methods for identification of outlier semiconductor devices using data-driven statistical characterization are described herein. At least some preferred embodiments include a method that includes identifying a plurality of sample semiconductor chips that fail a production test as a result of subjecting the plurality of sample semiconductor chips to a stress inducing process, identifying at least one correlation between variations in a first sample parameter and variations in a second sample parameter (the sample parameters associated with the plurality of sample semiconductor chips) identifying as a statistical outlier chip any of a plurality of production semiconductor chips that pass the production test and that further do not conform to a parameter constraint generated based upon the at least one correlation identified and upon data associated with at least some of the plurality of production semiconductor chips, and segregating the statistical outlier chip from the plurality of production semiconductor chip.

8 Claims, 6 Drawing Sheets

IDENTIFICATION OF OUTLIER SEMICONDUCTOR DEVICES USING DATA-DRIVEN STATISTICAL CHARACTERIZATION

CROSS-REFERENCE TO RELATED APPLICATIONS

This application is a non-provisional application claiming priority to U.S. Provisional Application Ser. No. 60/912,612 filed on Apr. 18, 2007, entitled "Identification Of Outlier Semiconductor Devices Using Data-Driven Statistical Characterization Of Good Semiconductor Devices," which is hereby incorporated by reference.

BACKGROUND

Semiconductor devices may be fabricated on the surface of a semiconductor wafer in layers and later cut into individual chips. The individual chips thus fabricated are subjected to a series of tests to determine if the chips function properly both before and after being cut. These tests are sometimes repeated at several points in the manufacturing process, since the steps involved in cutting and packaging the chips can result in thermal and mechanical stresses which can induce failures of individual chips. The tests are designed to identify parts that are actually failing when tested, a failure sometimes referred to as a "time-zero" failure.

But many failures that occur in semiconductor chips are not "time-zero" failures, but failures that occur later after the chips have been in operation for a short time. These failures, sometimes referred to as "infant-mortality" or "early" failures, are sometimes identified through the use of a "burn-in" process, in which the chips are operated for an extended period (compared to the duration of normal production testing) beyond the electrical and environmental ranges defined by the design engineers for normal operation. This operational test period may identify a significant number of failures, but this is accomplished at the expense of the additional cost of testing, as well as a reduced life expectancy of the chips tested.

Some manufacturers have used a "no burn-in" approach, using time-zero failures to predict early failures without a production burn-in. Using time-zero failures to predict marginal chips, however, does not always predict failures of chips that are defective. These unpredicted "statistical outliers" tend to increase in number as the dimensions of the semiconductor structures within the chips decrease, and are thus not reliably predicted by time-zero-based no burn-in techniques when applied to many of today's sub-micron semiconductor devices.

Analysis of devices that have actually failed can provide an improved statistical basis for identifying statistical outliers, as illustrated by the methods described in U.S. Pat. No. 7,129,735, issued on Oct. 31, 2006 and entitled "Method For Test Data-Driven Statistical Detection of Outlier Semiconductor Devices," which is herein incorporated by reference. But as production techniques and yields have improved, the number of failed devices has decreased, providing a progressively smaller sample size from which to extract failure data. Manufacturers have also increased the use of "stop on fail" testing (wherein testing of a device is stopped upon the occurrence of any failure) in order to decrease the overall testing time (and the associated cost of testing) of the devices. These factors result in a scarcity of failure data, which produces a decrease in the statistical confidence of the results of failure predictions based on the failure data, thus decreasing the reliability of the resulting failure predictions.

SUMMARY

Systems and methods for identification of outlier semiconductor devices using data-driven statistical characterization are described herein. At least some preferred embodiments include a method that includes identifying a plurality of sample semiconductor chips that fail a production test as a result of subjecting the plurality of sample semiconductor chips to a stress inducing process, identifying at least one correlation between variations in a first sample parameter and variations in a second sample parameter (the first and second sample parameters associated with the plurality of sample semiconductor chips) identifying as a statistical outlier chip any of a plurality of production semiconductor chips that pass the production test and that further do not conform to a parameter constraint generated based upon the at least one correlation identified and further based upon data associated with at least some of the plurality of production semiconductor chips that pass the production test, and segregating the statistical outlier chip from the plurality of production semiconductor chip.

Other preferred embodiments include a system that includes processing logic, and a non-volatile storage device coupled to the processing logic. The processing logic collects and stores on the non-volatile storage device sample test data used to identify a plurality of sample semiconductor chips that fail a production test as a result of subjecting the plurality of sample semiconductor chips to a stress inducing process, processes the stored collected sample test data to identify at least one correlation between variations in a first sample parameter and variations in a second sample parameter (the first and second sample parameters associated with the plurality of sample semiconductor chips), and identifies as a statistical outlier chip any of a plurality of production semiconductor chips that pass the production test and that further do not conform to a parameter constraint generated based upon the at least one correlation identified, and further based upon data associated with at least some of the plurality of production semiconductor chips that pass the production test.

Yet further preferred embodiments include a system that includes means for storing parameters associated with a plurality of sample semiconductor chips that fail a production test as a result of subjecting the plurality of sample semiconductor chips to a stress inducing process, means for identifying at least one correlation between variations in a first sample parameter and variations in a second sample parameter (the first and second sample parameters associated with the plurality of sample semiconductor chips), and means for identifying as a statistical outlier chip any of a plurality of production semiconductor chips that pass a production test and that further do not conform to a parameter constraint generated based upon the at least one correlation identified, and further based upon data associated with at least some of the plurality of production semiconductor chips that pass the production test.

Yet other preferred embodiments include a computer-readable medium comprising software that causes a processor to identify a plurality of sample semiconductor chips that fail a production test as a result of subjecting the plurality of sample semiconductor chips to a stress inducing process, to identify at least one correlation between variations in a first sample parameter and variations in a second sample parameter (the first and second sample parameters associated with the plurality of sample semiconductor chips), to identify as a statistical outlier chip any of a plurality of production semiconductor chips that pass the production test and that further do not conform to a parameter constraint generated based upon the at least one correlation identified, and further based upon data associated with at least some of the plurality of production semiconductor chips that pass the production test, and to segregate the statistical outlier chip from the plurality of production semiconductor chip.

BRIEF DESCRIPTION OF THE DRAWINGS

For a detailed description of preferred embodiments of the invention, reference will now be made to the accompanying drawings in which.

NOTATION AND NOMENCLATURE

Certain terms are used throughout the following discussion and claims to refer to particular system components. This document does not intend to distinguish between components that differ in name but not function. In the following discussion and in the claims, the terms "including" and "comprising" are used in an open-ended fashion, and thus should be interpreted to mean "including but not limited to . . ." Also, the term "couple" or "couples" is intended to mean either an indirect or direct electrical connection. Thus, if a first device couples to a second device, that connection may be through a direct electrical connection, or through an indirect electrical connection via other devices and connections. Further, the term "software" includes any executable code capable of running on a processor, regardless of the media used to store the software. Thus, code stored in non-volatile memory, and sometimes referred to as "embedded firmware," is included within the definition of software.

DETAILED DESCRIPTION

Semiconductor manufacturers have found that it is preferable to statistically predict reliability failures of production semiconductor chips rather than force the failures through burn-in processing of the chips (also sometimes referred to as "accelerated life testing"). Such reliability failures occur in chips that pass production testing, but later fail after being subjected to the stress of being operated, and are sometimes referred to as "statistical outliers." Both production test failures (also known as "time-zero" failures) and burn-in failures can be used as a statistical basis for predicting future reliability failures. But the use of time-zero failures as a basis for identifying statistical outliers has proven inadequate for the current generation of semiconductor chips, and methods using actual failures are limited in application due to the scarcity of failure data when compared to the number of "good electrical chips" (GECs) that are produced by a typical semiconductor production facility.

In accordance with at least some illustrative embodiments, an alternative to using failure data (i.e., data from or regarding actual failed devices) to predict statistical outliers is disclosed in which success data (i.e., test data characterizing components that pass all tests within prescribed limits) is used instead to identify statistical non-outliers within a GEC population (e.g., "good" components with test results that follow a Gaussian distribution or other similar statistical distribution within the GEC population). Statistical outliers are implicitly identified as those components that are not statistical non-outliers. The test data used to identify statistical outliers is the same data used to identify GECs. As a result, testing procedures already in place may continue to be used.

Figure 1A:
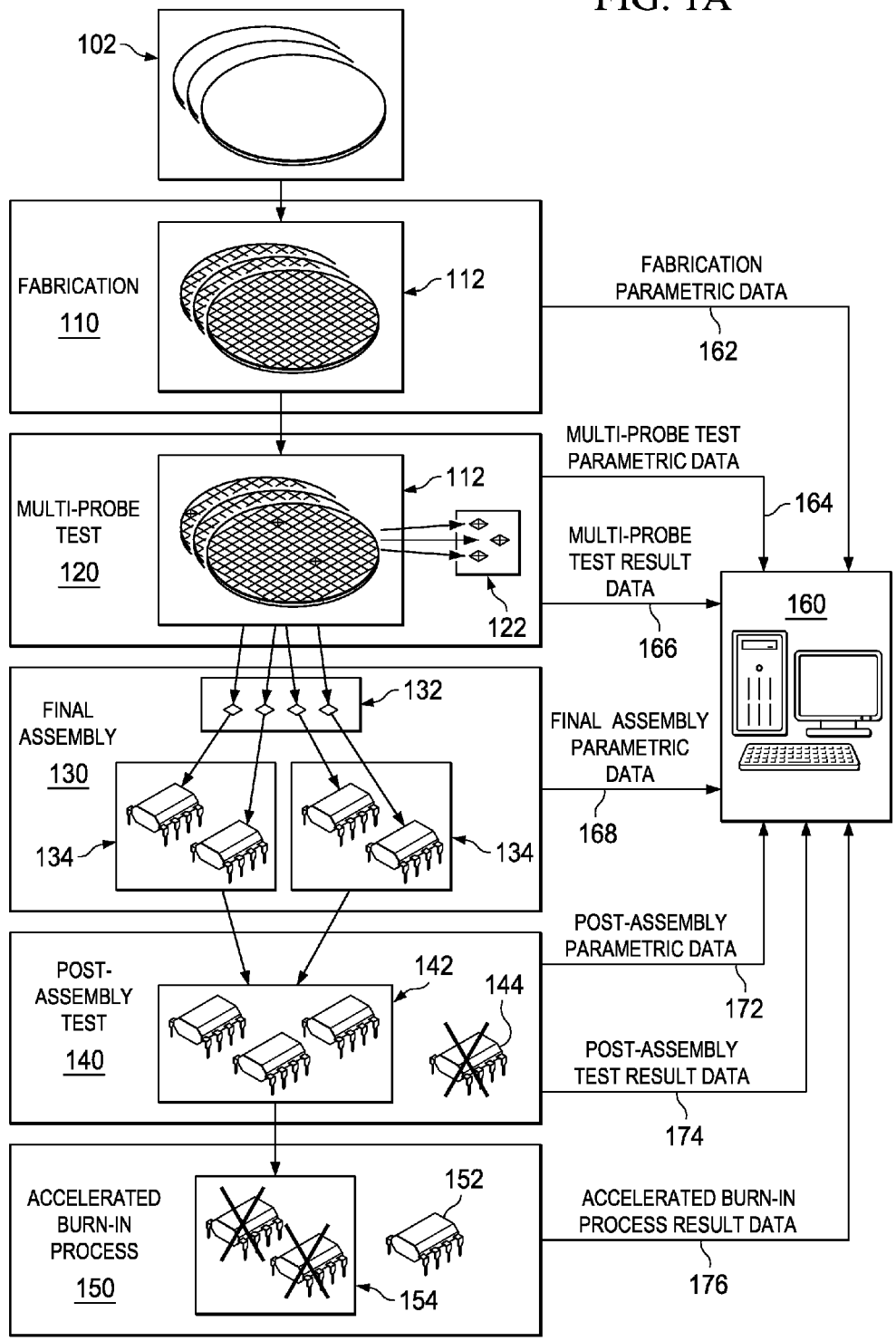
FIG. 1A shows the collection of data used to characterize good electrical chips (GECs) and identify statistical outliers, in accordance with at least some preferred embodiments of the invention.

FIG. 1A illustrates how parametric and test result data may be gathered from a sample group for use in identifying both statistical outliers and non-outliers of a GEC population within a production group. Starting at fabrication 110, a sample group 112 of semiconductor chips is manufactured using wafers 102. Fabrication parametric data 162 for the sample group 112 may be saved in a data processing and storage system 160 in accordance with at least some preferred embodiments. The data processing and storage system 160 of the illustrative embodiment shown comprises one or more centrally located computer systems (e.g., servers comprising processing logic) that collect and process the parametric data at each manufacturing stage as described, each system comprising a non-volatile storage device used to store the parametric data collected at each stage of the manufacturing process. In other preferred embodiments, the data processing and storage system 160 may be a distributed data processing and storage system. Many other data processing and storage system configurations will become apparent to those of skill in the art, and all such configurations are within the scope of the present disclosure. Further, the processing logic may be implemented in hardware, software, or combinations of hardware and software.

Figure 1B:
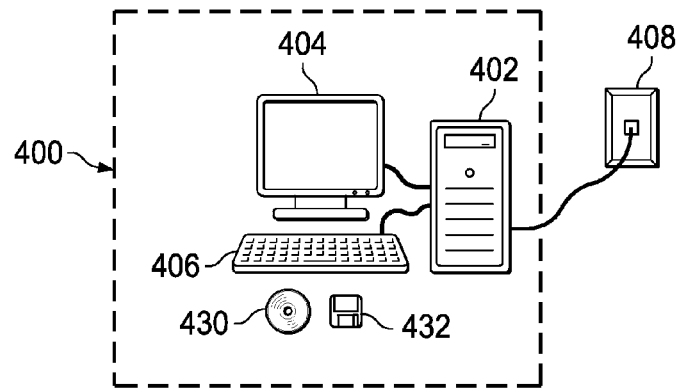
FIG. 1B shows an example of a system configuration, suitable for use as the data collection and storage system of FIG. 1A, in accordance with at least some illustrative embodiments.
Figure 1C:
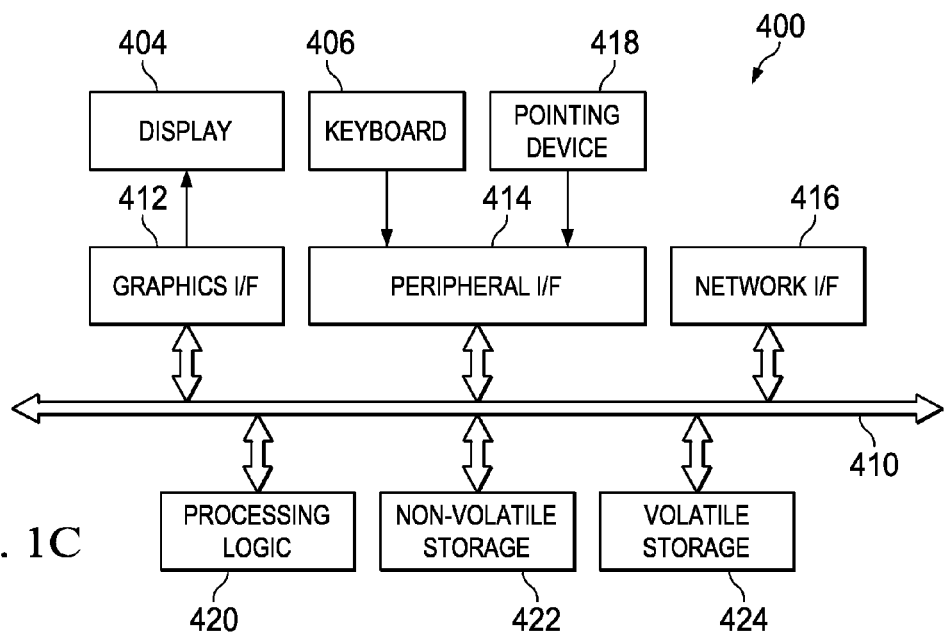
FIG. 1C shows a block diagram of the system configuration of 1B, in accordance with at least some illustrative embodiments.

FIGS. 1B and 1C show an illustrative system configuration 400 suitable for implementing the data processing and storage system 160 of FIG. 1A. As shown in FIG. 1B, the illustrative system configuration 400 includes a chassis 402, a display 404 and an input device (e.g., a keyboard) 406. The system configuration 400, as shown in FIG. 1C, further includes processing logic 420 (e.g., a microprocessor), non-volatile storage 422, and volatile storage 424. Non-volatile storage 422 includes a computer-readable medium such as a flash random access memory (flash RAM), a read-only memory (ROM), a hard disk drive, a floppy disk (e.g., floppy 432), a compact disk read-only memory (CD-ROM, e.g., CD-ROM 430), as well as combinations of some and/or all such medium. Volatile storage 424 includes a computer readable medium such as random access memory (RAM).

The computer readable media of both non-volatile storage 422 and volatile storage 424 include, for example, software that is executed by processing logic 420 and provides processing and storage system 160 with at least some of the functionality described herein. The system configuration 400 also includes a network interface (Network I/F) 416 that enables the system configuration 400 to transmit information to, and receive information from, a local area network (LAN) and/or a wide area network (WAN), represented in the example of FIG. 1B by Ethernet jack 408. A graphics interface (Graphics I/F) 412 couples to the display 404. A user interacts with the processing system via an input device such as keyboard 406 and/or pointing device (Pointing Dev) 418 (e.g., a mouse), which couples to a peripheral interface (Peripheral I/F) 414. The display 404, keyboard 406 and pointing device 418 together may operate as a user interface.

System configuration 400 may be a bus-based computer, with the bus 410 interconnecting the various elements shown in FIG. 1C. The peripheral interface 414 accepts signals from the keyboard 406 and other input devices such as pointing device 418, and transforms the signals into a form suitable for communication on bus 410. The graphics interface 412 may include a video card or other suitable display interface that accepts information from the bus 410 and transforms it into a form suitable for the display 404.

Processing logic 420 gathers information from other system elements, including input data from the peripheral interface 414, and program instructions and other data from non-volatile storage 422 or volatile storage 424, or from other systems (e.g., a server used to store and distribute copies of executable code) coupled to a local area network or a wide area network via the network interface 416. Processing logic 420 executes the program instructions and processes the data accordingly. The program instructions may further configure processing logic 420 to send data to other system elements, such as information presented to the user via the graphics interface 412 and display 404. The network interface 416 enables processing logic 420 to communicate with other systems via a network. Volatile storage 424 may serve as a low-latency temporary store of information for processing logic 420, and non-volatile storage 422 may serve as a long-term (but higher latency) store of information.

Processing logic 420, and hence the system configuration 400 as a whole, operates in accordance with one or more programs stored on non-volatile storage 422 or received via network interface 416. Processing logic 420 may copy portions of the programs into volatile storage 424 for faster access, and may switch between programs or carry out additional programs in response to user actuation of the input devices. The additional programs may be retrieved or received from other locations via network interface 416. One or more of these programs executes on system configuration 400, causing the configuration to perform at least some of the functions of data processing and storage system 160 as disclosed herein.

Referring again to FIG. 1A, in at least some illustrative embodiments, parametric data describes or otherwise is associated with a characteristic that comprises a measured or observed feature of a semiconductor chip or test structure outside the boundaries of the chip (e.g., a scribe line test structure), and/or of any operation performed on a semiconductor chip or wafer, and/or of any machine or process used to perform an operation on a semiconductor chip or wafer. Such parametric data is collected at any of several points during the manufacture and packaging of the semiconductor chip. The fabrication parametric data 162, for example, may include any suitable parametric data such as process type, number of layers, number of masks, target threshold voltages, doping concentrations, temperatures and humidity during each processing step, via or contact resistance measurements, and visual inspection results.

Following fabrication, the sample group 112 is subjected to a multi-probe test 120 in which the individual chips on each wafer of the sample group 112 are tested. In the illustrative embodiment shown, multi-probe test 120 comprises tests that identify those chips that function within the functional and electrical parameters defined by the design engineers (i.e., GECs). The multi-probe test result data 166 from the multi-probe testing 120, as well as the multi-probe test parametric data 164, is saved within data processing and storage system 160. The multi-probe test parametric data 164 may include chip position within a wafer, wafer identification, type of test equipment used, test program used, time and date of testing, and the number of chips that passed the multi-probe test (i.e., the number of GECs). Multi-probe testing is performed on one chip at a time, or on several chips in parallel (e.g., 2 chips at a time). In the case of parallel testing, the multi-probe test parametric data 164 may include the identity of the particular probe used to test a chip (allowing for later correction of probe-specific errors or adjustment for probe-specific biases).

After completion of multi-probe test 120, the chips within each wafer are singulated (i.e., separated from each other) into individual sample chips. The sample chips identified as the multi-probe time-zero failures 122 are separated from the sample group 112 and may be scrapped or may undergo additional testing or analysis. The remaining sample chips 132 that passed multi-probe testing are sent to final assembly 130. Final assembly parametric data 168 is saved within data processing and storage system 160 in accordance with at least some preferred embodiments. The final assembly parametric data 168 may include packaging type, assembly equipment used, bonding method used, and time and date of assembly.

After final assembly 130 is complete, the packaged sample chips 134 proceed to post-assembly test 140. Post-assembly test 140 may include tests similar to those executed during multi-probe test 120, and is also used to identify those packaged sample chips 134 that function within the functional and electrical parameters defined by the design engineers. In at least some preferred embodiments, the post-assembly test result data 174 from the post-assembly testing 140, as well as post-assembly parametric data 172, may be saved within data processing and storage system 160. The post-assembly parametric data 172 may include data similar to the multi-probe test parametric data 164, including the number of GECs.

Figure 2:
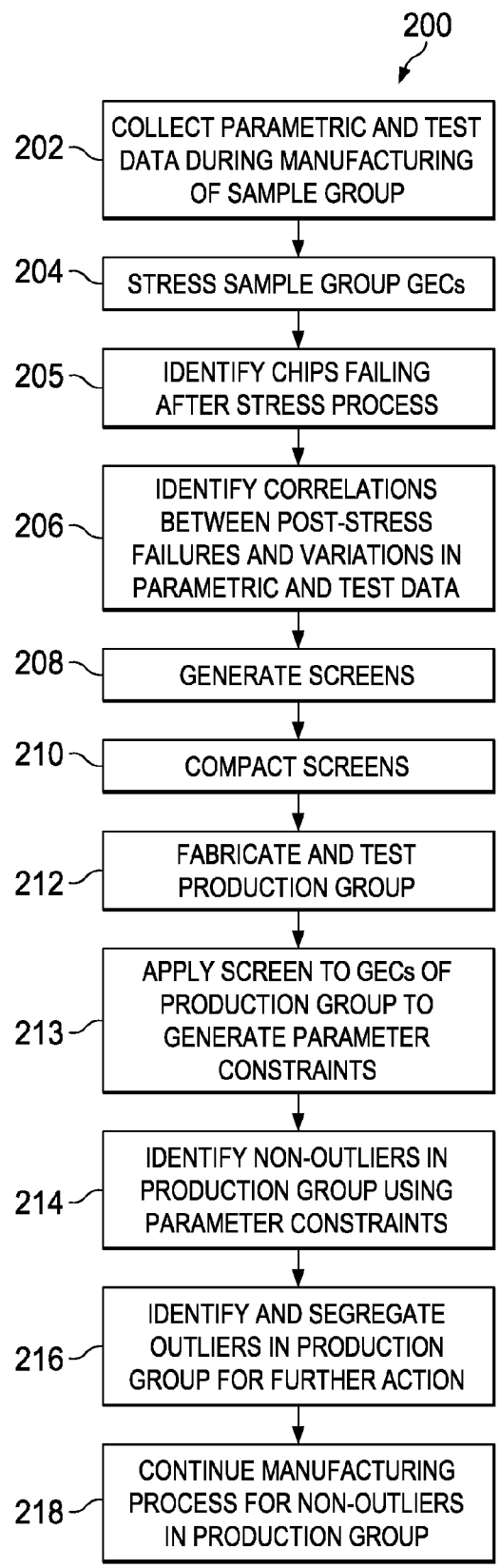
FIG. 2 shows a method for identifying statistical outliers within a GEC population, in accordance with at least some preferred embodiments of the invention.

After completion of post-assembly testing 140 the post-assembly time-zero failures 144 are separated from the packaged sample chips 134, and may be scrapped or may undergo additional testing or analysis. The packaged chips that passed post-assembly testing (burn-in sample group 142) are sent to the accelerated burn-in process 150. The accelerated burn-in process 150 subjects the burn-in sample group 142 to environmental and electrical conditions that may be, for some parts of the burn-in process, beyond the ranges defined by the design engineers for normal operation (i.e., as described in the design specification or "data sheet" for the semiconductor chip). This type of processing is performed in order to induce failures of chips within the burn-in sample group 142 with a reliability risk, and to induce such failures within a relatively short period of time (when compared to the life expectancy of a semiconductor chip operated within its normal operating range). The reliability failures are identified through repeated testing (similar to the testing done during both multi-probe and post-assembly testing) and may be performed before, during and after variations in environmental and electrical conditions are introduced into the burn-in environment. Although the illustrative embodiments of FIGS. 1 and 2 show the use of an accelerated burn-in process to stress the chips that are used as a source of data, one of ordinary skill in the art will recognize that other stress inducing processes, such as a cold temperature process, a vibration process, or normal operation over an extended period of time, just to name a few, may also be used as processes that stress chips that are used to provide data instead of, or in addition to, the data collected from chips subjected to the accelerated burn-in process. All such stress inducing processes are within the scope of the present disclosure.

In at least some preferred embodiments, once the accelerated burn-in process 150 has been completed, the burn-in failures 154 are separated from the remaining operational parts 152. The accelerated burn-in process data 176, reflecting the test results of the burn-in failures and of the remaining operational parts 152, is saved within data processing and storage system 160. Parametric and test result data saved within data processing and storage system 160, starting at chip fabrication 110 and ending at post-assembly testing 140, may then be correlated with the accelerated burn-in process data 176 for working packaged chips with statistically similar test results. Statistical methods may be used to perform the correlation and may include, for example, linear and non-linear regression, reticle shot area statistical analysis, neighborhood or other zonal analysis, multivariate analysis, classification and regression tree, and principal component analysis.

Parameters (which include both parametric data and testing results) with variations that have statistically significant correlations to particular test results may then be used to generate one or more corresponding screens that are used to produce parameter constraints. These parameter constraints provide a basis for delineating the limits of what is defined as an outlier or a non-outlier semiconductor chip within the GEC population. In at least some preferred embodiments, a screen is comprised in part of chip-specific parameter constraints that are compared with the production multi-probe test results and parametric data. If an applicable test result or other parameter for the production chip is within the limits of a parameter constraint, the production chip is identified as a non-outlier. After all production chips within a test group have been tested, any production chips that are not identified as a non-outlier are treated as suspect and separated from the production group. The suspect production chip may then be scrapped, tested further, or segregated for further analysis.

By defining what constitutes a non-outlier electrical chip, the methods of the embodiments described makes use of the data available from the large number of good chips that pass the various tests applied (GECs). This data is further not impacted by the use of "stop on fail" testing, where all testing of a part ceases upon detection of a single failure. This is due to the fact that the described method is insensitive to failures, relying instead upon the data collected from all chips that have executed the full test and thus have an optimized data set for each test performed, barring any failures in the test process itself. Data from failing chips is utilized under the assumption that the data from a chip that is affected by a defect is distinct from the GEC data. The distinction between failing chip data and GEC data is manifested in the results of the statistically processed data, and it is these statistical results that permit "bad" data (data that has a low correlation to future performance and reliability of the chip) collected from failing chips to be differentiated from "good" data (data that has a high correlation to future performance and reliability of the chip) collected from failing chips. The "good" data thus identified is used as a basis for selecting the parameters for which parameter constraints are generated (using GEC data) and used to identify outliers and non-outliers within the GEC population. By increasing the amount of data available for statistical calculations used to generate the parameter constraints, the statistical confidence of the resulting parameter constraints is increased, resulting in better correlations between the parameter constraints and the prediction of a statistical outlier failure. Also, because the methods of the embodiments described do not require the detection of specific categories of failures, no special testing is required. This permits a semiconductor manufacturer to develop and use standard tests for all semiconductor designs, and to use the described methods with existing production lines without the need to alter existing test programs.

Further, as production methods continue to improve, more success data and less failure data will be available to predict statistical outliers. More data produces predictors with a higher statistical confidence; less data produces predictors with a lower statistical confidence. As the statistical confidence of a predictor increases, the probability of error decreases. Conversely, as the statistical confidence of a predictor decreases, the probability of error in the prediction increases. Thus, because of the large amount of statistical data that is used as a foundation to characterize GECs, as compared to the scarce amounts of failure data sometimes used to directly predict statistical outliers, the penalty paid as a result of misidentifying (as non-statistical outliers) chips that actually later fail based upon GEC data (a cost measured as bad chips passed as good, also referred to as a statistical Type II error) is lower than the cost associated with misidentifying statistical outliers as non-outliers based upon failure data (a cost measured as good chips discarded as bad, also referred to as a statistical Type I error).

FIG. 2 illustrates a method 200 for statistically identifying outliers of a GEC population within a production group of semiconductor chips, based at least in part on the characterization of good chips within a sample group, in accordance with at least some preferred embodiments. The method 200 uses collected and statistically processed parametric and test result data to characterize chips (GECs), thus deriving a set of parameter constraints that represent the statistical norm for a properly functioning device. The necessary parametric and test data (e.g., as detailed above) is collected during the manufacturing of a sample group as shown in block 202. The GECs within the sample group are subjected to a stress inducing process (e.g., an accelerated burn-in process), as shown in block 204, which forces reliability failures to occur in a relatively short period of time. In at least some illustrative embodiments, this stress inducing process includes testing (during and/or after the process) that identifies semiconductor chips that have failed (block 205), and provides additional base data that is also used to characterize semiconductor chips within the sample group that have not failed. Semiconductor chips that fail are characterized for the purpose of later determining an optimized set of parameter constraints (compaction), as described below.

After the accelerated burn-in process has been completed, the parametric and test data that was collected during manufacturing is used to identify correlations between variations in the parametric and test data with the burn-in process results for semiconductor chips that failed during the burn-in process, as shown in block 206. Screens are generated in block 208, wherein each screen is based on a parameter variation with a statistically significant correlation to the measured and/or observed parametric data and/or test performance of any of a variety of statistical groupings of semiconductor chips that failed. Such correlations provide a basis for defining what constitutes an outlier or a non-outlier within a population of GECs by identifying a core group within the sample group that represents the "best" chips, i.e., those chips most likely to have the highest performance and yields. The correlations provide a basis for creating the screens, which comprise mathematical equations and chip groupings used to perform reference calculations for each chip on a wafer within a production group and thus derive parameter-specific constraints for the chip being evaluated.

Continuing to refer to the preferred embodiment of FIG. 2, after the screens are generated in block 208, the screens are compacted down in block 210 to a subset of screens, using any one of a variety of statistical techniques (as described above). The compaction comprises removing at least some screens that may include duplicate predictive information and thus may not be needed. The compaction procedure may also comprise eliminating screens with correlations that are not statistically significant, or that are less statistically significant than other screens. The compaction is used to arrive at a reduced spanning set of screens that are used to generate parameter constraints that define what constitutes a non-outlier chip, and to identify such chips.

Once generated and compacted, the screens may be used in a production environment. After a production group of chips has completed fabrication and at least one production test (e.g., multi-probe) as shown in block 212, the screens are applied to the chips that have passed the production test to generate one or more parameter-specific constraints (block 213). In at least some preferred embodiments, the production chips with parameters within the prescribed constraints selected for comparison are identified as non-outliers, as shown in block 214. The remaining production chips are identified as statistical outliers, and are segregated from the production group for additional action as shown in block 216. Such additional action may include scrapping, downgrading, and/or performing additional testing, analysis, and burn-in of the outliers. Once the outliers have been segregated, either physically or electronically, the remaining GECs (i.e., the non-outliers) may then be allowed to continue through the manufacturing process as shown in block 218.

As noted above, a screen includes both the mathematical calculations used to generate parameter constraints, as well as a data selection or "grouping" used to select chips to provide the foundation data used in the mathematical calculations. The groupings comprise selections of chips proximate to the chip tested that provide the best correlation between a given set of parameters. The groupings are determined on a correlation-by-correlation basis, and further on a parameter-by-parameter basis. Thus, a screen is associated with each chip for each correlation. The grouping of proximate chips to use around a chip tested is determined by defining a matrix of chips around the chip of interest, and identifying those proximate chips that, as a group, perform best. "Best" may be defined in a number of ways, for example, as those chips that comprise a parameter grouping that is within one sigma of the mean or a median for the chips within the matrix. The grouping of selected chips thus provides a localized definition of what is a non-outlier for the parameter of interest. The grouping of chips is then used as a basis for determining one or more correlations between parameters. The resulting correlations are combined with the grouping to define one or more screens.

Figure 3A:
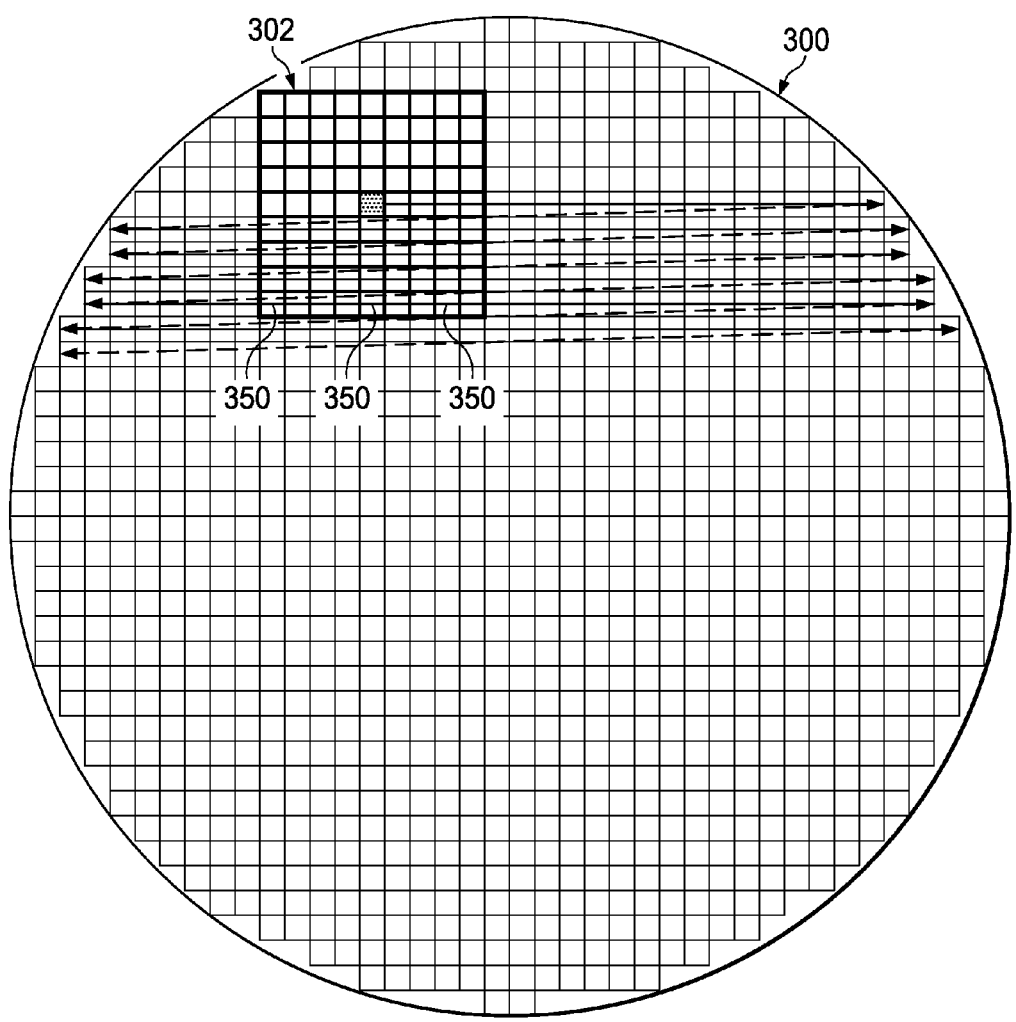
FIGS. 3A through 3C show various groupings for collecting statistical data, in accordance with at least some preferred embodiments.
Figure 3B:
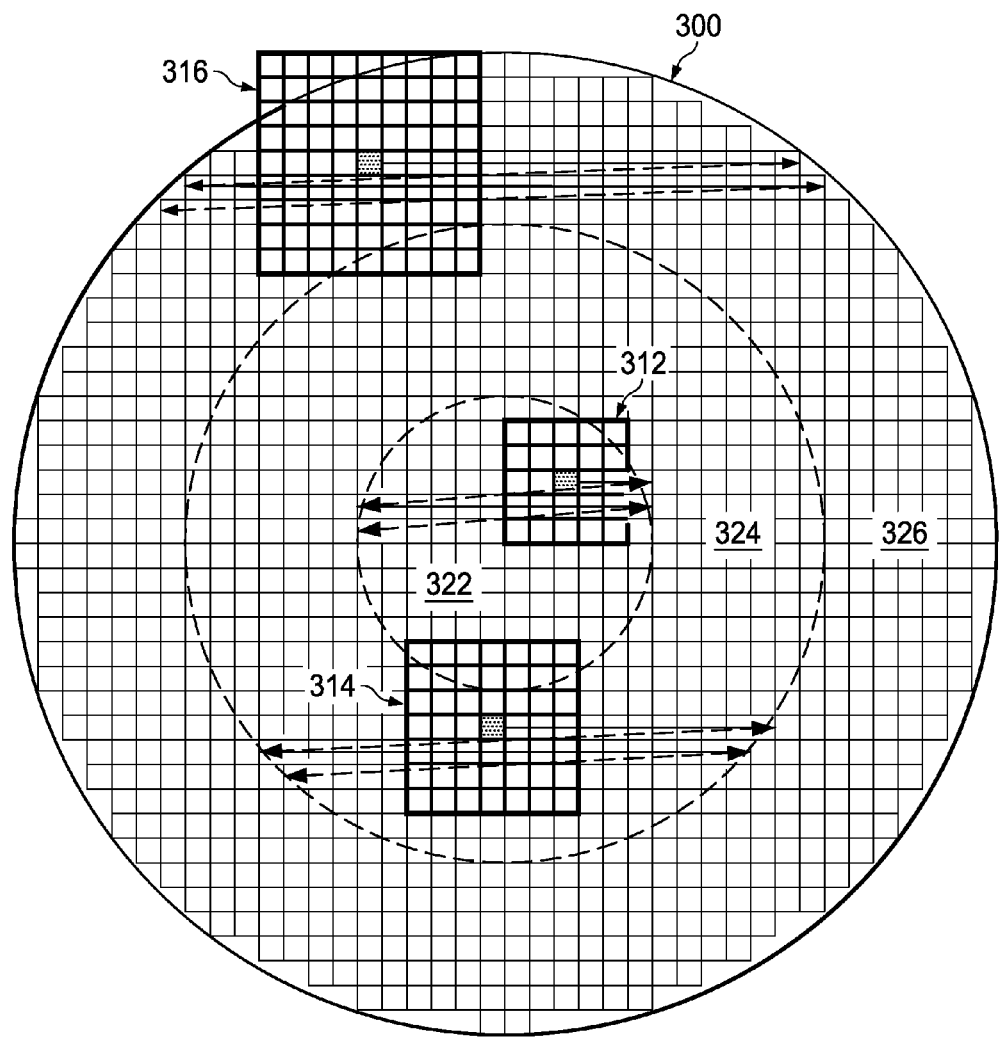
Figure 3C:
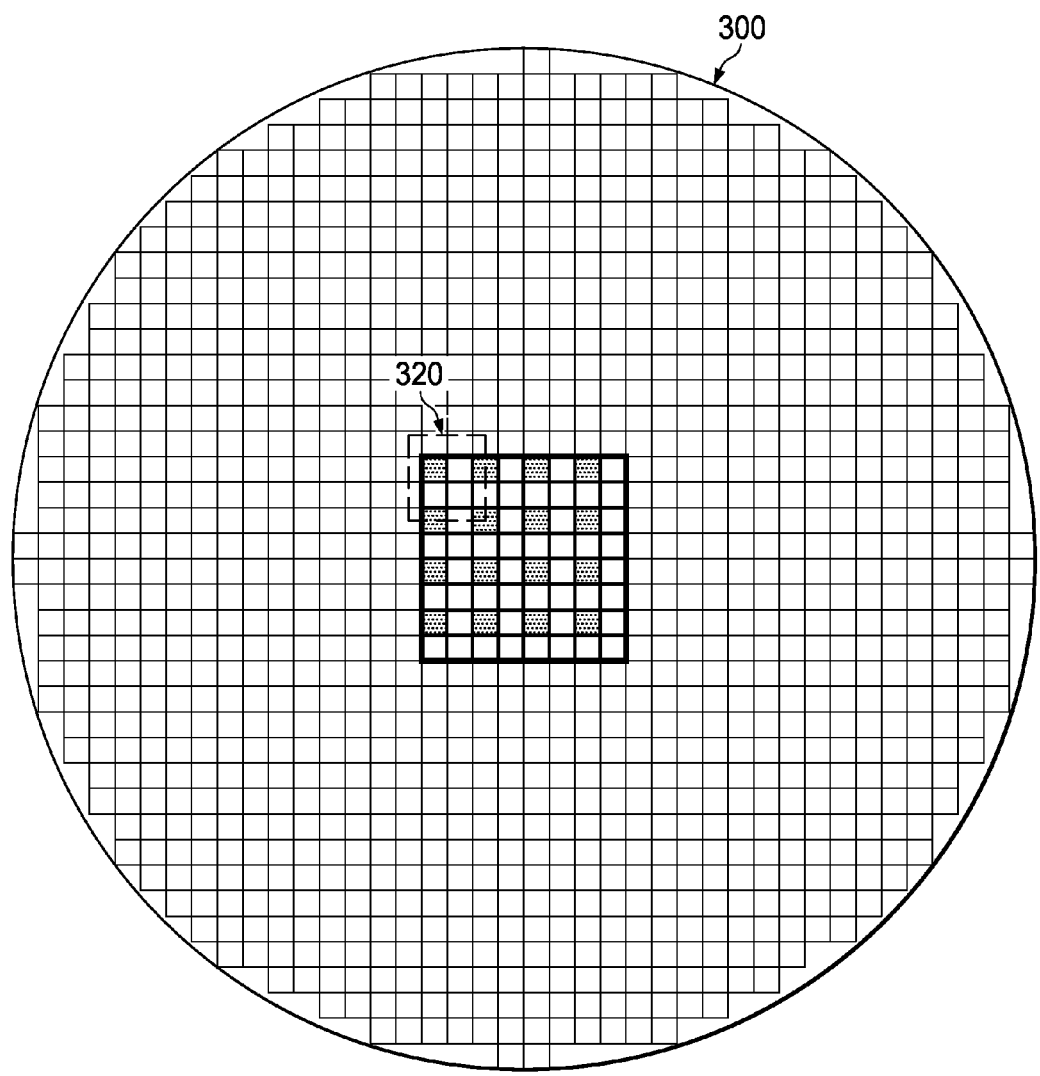

FIGS. 3A through 3C show examples of how groupings are determined for each chip position on a wafer, in accordance with at least some preferred embodiments. A matrix 302 of chips (e.g., a 9×9 rectangular matrix) is defined around a chip of interest (shown as a darkened square), and a screen determined as described above. The matrix 302 is then re-centered around the next chip in sequence, and the process repeated until screen sets for all chip positions have been generated. FIG. 3A shows an example of a sequence pattern (show with arrows), wherein the screen set for a chip is generated for each chip from left to right on a horizontal line, and then for each row of chips from top to bottom. Other sequences will become apparent to those skilled in the art, and all such sequences are within the scope of the present disclosure.

Statistical analysis is applied to the measured and/or observed parameters from GECs within the grouping throughout the process shown in FIG. 1A, to determine correlations between a parameter variation and another parameter (e.g., the number of GECs), as well as correlations between a variation in one parameter and a statistical distribution of the same parameter or another parameter. If a correlation is found, a mathematical filter is generated that screens for the variation. This filter is used as a screen that is applied to one or more chips of a production wafer to derive one or more chip-specific parameter constraints from each production chip on the production wafer being tested.

The selection of the screen is based on the degree of correlation between variations between parameters associated with the GECs. A high degree of correlation indicates that the screen is a good predictor of non-outliers within the GEC population. Such correlations may be found using any number of known mathematical analyses, such as those already described above. In addition extreme outliers may be removed from the calculations using, for example, the diagonals of a hat matrix, with the remaining data used to generate prediction intervals on a regression line (e.g., using a robust regression that uses an iteratively re-weighted least squares method). The use of such prediction intervals thus effectively allows the application of multiple limits using a single screen.

As already noted, variations in measured and/or observed parameters are used in at least some preferred embodiments as a basis for characterizing GECs and generating screens that are applied to the production chips to identify statistical outliers and non-outliers. Thus, for example, if it is determined that a 10% variation from the mean or median of a measured and/or observed parameter as calculated for the 8×8 central matrix of chips for the sample wafer correlates to a 2 sigma distribution of good chips (selected in this example as defining the boundaries of what is defined as a non-outlier), then that same variation may be used to identify non-outliers and outliers in the production wafers. The identification of non-outliers and outliers is achieved by applying the screen and performing the same calculation to generate a parameter constraint based on the mean or median of the measured and/or observed parameter (this time measured on the production chip) and an acceptable range of deviation from said mean or median, which is then applied to some or all of the chips on the wafer.

Alternatively, different matrices may be used for specific regions of a wafer. FIG. 3B shows an example of the use of "ringed" or annular regions 312, 314 and 316 within a wafer, in accordance with at least some preferred embodiments. In the example of FIG. 3B a matrix of a different size is used for each region and each matrix is applied to the corresponding region in a manner similar to that described for FIG. 3A. A matrix is systematically applied to each chip within the region corresponding to the matrix, resulting in the production of screens for each parameter for each chip. In the preferred embodiment shown in FIG. 3B, a 5×5 matrix 312 is used in the center region 322, a 7×7 matrix 314 is used in the middle region 324, and a 9×9 matrix 316 is used in the outer regions 326. Such a multi-region configuration may be used on a wafer with large numbers of chips in order to reduce the number of calculations needed to generate both the screen from the sample group, as well as the parameter constraints using the screen with a production group. In other preferred embodiments, some regions within a multi-region configuration are skipped entirely, and screen generation is performed based on the results from the remaining non-skipped regions of the wafer. Other region and matrix definitions and geometries will become apparent to those skilled in the art, and all such definitions and geometries are within the scope of the present disclosure.

In at least some preferred embodiments, groupings are not limited to adjacent geographic areas on a wafer, but may also include groupings based on reticle position. FIG. 3C shows an example of a 2×2 reticle 320 stepped across wafer 300, wherein the position (shown as a darkened square) of the reticle 320 is used as a basis for the grouping within a 9×9 matrix stepped across the wafer, in accordance with at least some preferred embodiments. The same types of groupings, matrices and statistical analysis may be applied as in the examples of FIGS. 3A and 3B to determine screens and subsequent parameter constraints. By taking into account the stepping of the reticle, systematic reticle-related behavior can be characterized and used as a predictor of statistical outliers. As before multiple matrices within multiple regions may be used to reduce the computational burden placed on the computational equipment. Reticle-based grouping may also be combined with any of the other groupings previously described. Other groupings and combinations of groupings will become apparent to those skilled in the art, and all such groupings and combinations are within the scope of the present disclosure.

A parameter constraint may also be defined using a screen based upon multiple parameters, variations and correlations. A parameter constraint so defined may be viewed as a "signature" which may be applied to the corresponding signature of a production device. Thus, a device that is identified as a non-outlier when one parameter variation is considered in isolation might not be identified as a non-outlier (i.e., is identified as a statistical outlier) when several parameters are considered together in the form of a signature when the screen is generated. Such combinations may include differences between a minimum/maximum measurement and the mean value of the same measurement, or the ratio of two measurements, just to name a few examples. Other combinations of parameters for creating screens will become apparent to those skilled in the art, and all such combinations are within the scope of the present disclosure.

Screens and their resulting parameter constraints may also be selected for use "on-the-fly," i.e., during data collection, based upon a calculated correlation determined as the data is run through a series of screens during production. The parameter constraint resulting from the application of a particular screen may or may not be used for a particular parameter, depending upon the degree of correlation of variations between parameters of the GECs for each screen and its corresponding parameter (i.e., its ranking relative to other screen/parameter pairs). The use of on-the-fly selection of parameter constraints accounts for variations in processing that may affect the correlation between parameter variations. In at least some preferred embodiments, the determination of which parameters, parameter constraints and screens are used is accomplished using principal component analysis. Other multi-variate techniques suitable for on-the-fly parameter, parameter constraint and screen selection will become apparent to those skilled in the art, and all such techniques are within the scope of the present disclosure.

As already noted, it is possible to test more than one chip at a time. The use of multiple parallel probes, however, can introduce probe-specific errors, such as probe-specific offset voltages and currents. As with the case of the reticle specific groupings of FIG. 3C, data samples can also be grouped by probe and recombined after statistically normalizing probe differences. Such normalizations may include, for example, mean and distribution shifting. By normalizing and combining parallel probe data, the methods of at least some of the preferred embodiments described may be applied to a variety of both sequential testing configurations, as well as parallel multi-probe testing configurations. Other normalization techniques suitable for compensating for probe differences will become apparent to those of ordinary skill in the art, and all such techniques are within the scope of the present disclosure. The resulting methods of at least some of the preferred embodiments thus may be implemented independent of whether the system used to test the chips utilizes a single probe or multiple probes.

The above disclosure is meant to be illustrative of the principles and various embodiments of the present invention. Numerous variations and modifications will become apparent to those skilled in the art once the above disclosure is fully appreciated. For example, any parameter that can be measured or observed during the manufacturing, testing and packaging of a semiconductor chip, not just those parameters described in the present disclosure, may be used as a basis for generating a parameter constraint or a screen so long as a statistically significant correlation can be established between variations in the parameters (or groups of parameters). It is intended that the following claims be interpreted to embrace all such variations and modifications.

What is claimed is:

1. A method, comprising:
   identifying a plurality of sample semiconductor chips that fail a production test as a result of subjecting the plurality of sample semiconductor chips to a stress inducing process;
   identifying at least one correlation between variations in a first sample parameter and variations in a second sample parameter, the first and second sample parameters associated with the plurality of sample semiconductor chips;
   identifying as a statistical outlier chip any of a plurality of production semiconductor chips that pass the production test and that further do not conform to a parameter constraint generated based upon the at least one correlation identified and further based upon data associated with at least some of the plurality of production semiconductor chips that pass the production test;
   segregating the statistical outlier chip from the plurality of production semiconductor chip;
   identifying a plurality of correlations between a plurality of parameters associated with the plurality of sample semiconductor chips;
   ranking the plurality of correlations; and
   identifying the at least one correlation based at least in part on the ranking.

2. The method of claim 1, further comprising:
   generating a screen associated with the at least one correlation; and
   generating the parameter constraint by applying the screen to one or more groupings of production semiconductor chips of the plurality of production semiconductor chips that pass the production test.

3. The method of claim 2,
   wherein generating the screen comprises defining one or more mathematical computations based upon the at least one correlation, and defining the one or more groupings of chips within a wafer; and
   wherein applying the screen comprises manipulating the one or more production parameters using the one or more mathematical computations.

4. The method of claim 2, wherein at least one of the one or more groupings comprises a plurality of selected production chips positioned proximate to the center of a wafer comprising the plurality of production semiconductor chips.

5. The method of claim 2, wherein a plurality of concentric annular regions are defined on a wafer comprising the one or more production semiconductor chips, and wherein the one or more groupings each comprises a plurality of selected production semiconductor chips, each of the selected production semiconductor chips located within one of the plurality of concentric annular regions.

6. The method of claim 2, wherein the one or more groupings each comprises a plurality of selected sample chips, each production semiconductor chip located at a particular position within a reticle used to produce a wafer comprising the plurality of production semiconductor chips.

7. The method of claim 2, wherein the one or more groupings each comprises a plurality of selected production semiconductor chips, each selected production semiconductor chip associated with a particular test probe of a plurality of test probes used to collect data from the plurality of production semiconductor chips.

8. The method of claim 1, further comprising:
adjusting the at least one correlation based upon correlations between a plurality of parameters associated with the plurality of production semiconductor chips; and
adjusting the ranking based upon the at least one adjusted correlation.

* * * * *